(12) United States Patent
Chung et al.

(10) Patent No.: US 8,273,533 B2
(45) Date of Patent: Sep. 25, 2012

(54) PATTERNED SPOT MICROARRAY USING PHOTOCATALYST AND METHOD OF MANUFACTURING THE SAME

(75) Inventors: Jong-suk Chung, Yongin-si (KR); Kyu-youn Hwang, Yongin-si (KR); Jeo-young Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 411 days.

(21) Appl. No.: 11/670,207

(22) Filed: Feb. 1, 2007

(65) Prior Publication Data

US 2008/0124719 A1 May 29, 2008

(30) Foreign Application Priority Data

Jul. 25, 2006 (KR) .................. 10-2006-0069797

(51) Int. Cl.
*C12Q 1/68* (2006.01)
(52) U.S. Cl. ................... 435/6.11; 427/2.11
(58) Field of Classification Search .............. None
See application file for complete search history.

(56) References Cited

U.S. PATENT DOCUMENTS

| | | | |
|---|---|---|---|
| 5,143,854 A | 9/1992 | Pirrung et al. | |
| 5,424,186 A | 6/1995 | Fodor et al. | |
| 5,445,934 A | 8/1995 | Fodor et al. | |
| 5,744,305 A | 4/1998 | Fodor et al. | |
| 2002/0127589 A1* | 9/2002 | Sato et al. | 435/6 |
| 2003/0059686 A1* | 3/2003 | Kobayashi et al. | 430/5 |
| 2003/0148401 A1 | 8/2003 | Agrawal et al. | |
| 2004/0050701 A1* | 3/2004 | McEntee et al. | 204/465 |
| 2004/0109935 A1 | 6/2004 | Goldberg et al. | |
| 2004/0203056 A1 | 10/2004 | Beecher et al. | |
| 2005/0008674 A1 | 1/2005 | Wagner et al. | |
| 2005/0059169 A1 | 3/2005 | Hattori | |
| 2005/0214855 A1 | 9/2005 | Wagner et al. | |

FOREIGN PATENT DOCUMENTS

| | | |
|---|---|---|
| EP | 1643248 A1 | 5/2006 |
| WO | 0226376 A2 | 4/2002 |
| WO | WO02/26376 * | 4/2002 |
| WO | 2006071696 A2 | 7/2006 |

OTHER PUBLICATIONS

Barczak et al. (Genome Research, 2003, vol. 13, p. 1775-1785).*
MicroQuill(™) DNA array pin (from www.majerprecision.com/?cid=research&pid=mqap).*
Park et al. (Cytotechnology, 2000, vol. 33, p. 117-122).*
Stadler et al. (Langmuir, 2004, vol. 20, No. 26, p. 11348-11354).*
Kocher et al. (Adv. Funct. Mater., 2001, vol. 11, No. 1 p. 31-35).*
European Search Report dated Nov. 28, 2007 for Application No. 07101575.4. Korean Office Action dated Jul. 27, 2007 for Application No. 10-2006-0069797 (All references cited in Office Action are listed above).
European Office Action dated Feb. 12, 2009 for Application No. 07101575.4.

* cited by examiner

*Primary Examiner* — Stephanie K Mummert
(74) *Attorney, Agent, or Firm* — Cantor Colburn LLP

(57) ABSTRACT

Provided is a method of preparing a patterned spot microarray using a photocatalyst. The method comprises coating the photocatalyst on a substrate to form a photocatalyst layer, coating a composition comprising a functional group to be connected to a biomolecule on the photocatalyst layer to form an organic layer, spotting the biomolecule on the organic layer, positioning a photomask above a spot of the biomolecule; and irradiating the spot through the photomask to pattern the spot.

12 Claims, 3 Drawing Sheets

SEQUENCE LISTING

```
<160> NUMBER OF SEQ ID NOS: 2

<210> SEQ ID NO 1
<211> LENGTH: 19
<212> TYPE: DNA
<213> ORGANISM: Artificial Sequence
<220> FEATURE:
<223> OTHER INFORMATION: probe polynucleotide coupled with NH2-(CH2)-
      group at it's 5' terminal

<400> SEQUENCE: 1
gatggaaggt gctgggagc                                                    19

<210> SEQ ID NO 2
<211> LENGTH: 19
<212> TYPE: DNA
<213> ORGANISM: Artificial Sequence
<220> FEATURE:
<223> OTHER INFORMATION: target polynucleotide labelled with Cy-3 at
      it's 3' terminal

<400> SEQUENCE: 2
gctcccagca ccttccatc                                                    19
```

PATTERNED SPOT MICROARRAY USING PHOTOCATALYST AND METHOD OF MANUFACTURING THE SAME

This application claims the benefit of Korean Patent Application No. 10-2006-0069797, filed on Jul. 25, 2006, and all the benefits therefrom under 35 U.S.C. §119, the disclosure of which is incorporated herein in its entirety by reference.

BACKGROUND OF THE INVENTION

1. Field of the Invention

The present invention relates to a method of preparing an integrated spot microarray by forming a pattern on a formed spot using a photocatalyst, a microarray and a microarray substrate manufactured according to the method.

2. Description of the Related Art

A DNA microarray (also called a DNA chip) can be used to detect a biomolecule (DNA, RNA, or the like) existing in a sample from a living body. Using a DNA microarray, several hundreds through tens of thousands of biomolecules can be detected and nucleotide sequences thereof can be determined in parallel. On a DNA microarray, a high density of DNA detection points (spots) are regularly arranged on a glass substrate or a silicon substrate of a determined size, usually from several square centimeters to several tens of square centimeters. Immobilized to each spot is a single-stranded nucleic acid of known sequence (e.g., a gene fragment) that can function as a probe (detector). Generally, microarrays with high spot density are preferred since they provide the capability of detecting more biomolecules in parallel in one reaction.

Detection of a biomolecule (e.g. DNA) using a microarray is achieved when a biomolecule complementary to an immobilized probe polynucleotide hybridizes with the probe and is thus retained on the microarray surface. For example, an aqueous solution containing fluorescent-labeled nucleic acids can be applied to the surface of a microarray to let the nucleic acids hybridize to complementary probes on the microarray surface. The solution is then removed and only nucleic acids hybridized to the probes on the microarray surface are retained after the procedure. By detecting fluorescence of the fluorescent material labeling the nucleic acids hybridized to probes on the DNA microarray, it can be determined whether any nucleic acids complementary to the probes were present in the sample nucleic acids.

DNA microarrays can be classified into two kinds based on the method of manufacturing the microarray: a photolithography type and a spotting type.

The photolithography type is prepared by synthesizing oligonucleotides on a substrate using a photolithography method used in a manufacturing process for a semiconductor integrated circuit. The resulting DNA microarray can have a high density of DNA detection points. Illustrative methods for manufacturing such polynucleotide microarrays are disclosed in U.S. Pat. Nos. 5,744,305 and 5,445,934.

In contrast, the spotting type is prepared by spotting droplets of a solution containing a prepared probe oligonucleotide on the surface of a substrate (e.g. an aminosilane-coated substrate). The oligonucleotides can covalently attach to the substrate when dried. Illustrative methods for manufacturing such polynucleotide microarrays are disclosed in U.S. Pat. No. 5,87,522.

These two kinds of DNA microarrays have different properties. DNA microarrays made by the photolithography method ensure a high measuring sensitivity and reproducibility, and can be used in analyzing a single nucleotide polymorphism (SNP). However, the method and resultant microarrays are expensive since a mask for each base needs to be made prior to the synthesis and each mask is expensive to make. For example, 80 masks are required when a probe having 20 bases is synthesized. Thus, only a few research institutions can afford to use DNA microarrays made using the photolithography method.

Microarrays manufactured by the spotting method are inexpensive since the method only involves oligonucleotide solutions and a substrate. However, the resulting DNA microarrays have lower density and uniformity of DNA immobilized on the substrate compared to those made by the photolithography method. For example, recently marketed microarrays manufactured by the photolithography method have a spot size of about 5 μm; while those manufactured by the spotting method have a minimum spot size of about 60 μm (SMP2 pin). As a result, microarrays manufactured by the spotting method have a lower spot density than those manufactured by the photolithography method.

Accordingly, there is a need to reduce spot size to make microarrays with high spot density. The present invention provides methods to address the need.

SUMMARY OF THE INVENTION

In the present invention a photocatalyst layer is formed on a substrate by coating a photocatalyst, such as $TiO_2$, on the substrate. The photocatalyst can be transformed into a radical upon irradiation with light and oxidize organic compounds thereon. A microarray having a reduced spot size can thereby be manufactured by patterning existing spots using the photocatalyst.

Disclosed herein are methods of preparing a patterned spot microarray.

In one embodiment, the method comprises coating a photocatalyst on a substrate to form a photocatalyst layer; coating a composition comprising a functional group to be connected to a biomolecule on the photocatalyst layer to form an organic layer; spotting the biomolecule on the organic layer; positioning a photomask above a spot of the biomolecule; and irradiating the spot with light through the photomask to pattern the spot.

Also disclosed herein is a microarray, prepared by the above method, in which the size of a patterned spot can be reduced.

Also disclosed herein is a microarray substrate comprising a photocatalyst layer coated on a substrate; and an organic thin film layer coated on the photocatalyst layer, wherein the organic layer comprises a composition comprising a functional group to be connected to a biomolecule.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
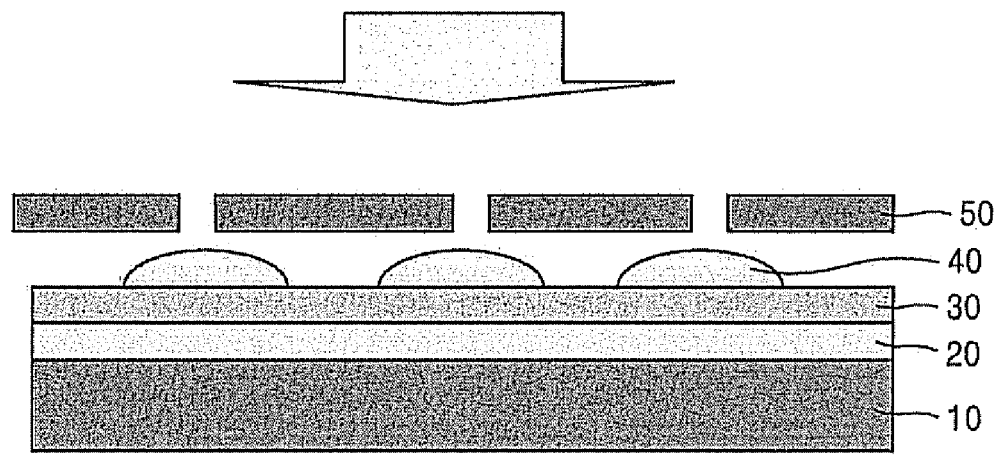
FIG. 1 is a diagram illustrating a microarray according to an embodiment of the invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In the present invention a photocatalyst layer is formed on a substrate by coating a photocatalyst, such as $TiO_2$, on the substrate. The photocatalyst can be transformed into a radical upon irradiation with light and oxidize organic compounds. A microarray having a reduced spot size can thereby be manufactured by patterning existing spots using the photocatalyst.

Disclosed herein is a method of preparing a patterned spot microarray using a photocatalyst. The method comprises coating a photocatalyst on a substrate to form a photocatalyst layer; coating a composition comprising a functional group to be connected to a biomolecule on the photocatalyst layer to form an organic layer; spotting the biomolecule on the organic layer; positioning a photomask above a spot of the biomolecule; and irradiating the spot with light through the photomask to pattern the spot.

In an embodiment of the invention, a photocatalyst is transformed into a radical when irradiated with light, such as ultraviolet light. The resulting radical can oxidize organic compounds. Thus, when light is irradiated on a microarray according to the invention, an organic thin film layer formed on the photocatalyst layer, as well as biomolecules spotted on the microarray, are oxidized, resulting in a reduced size of the biomolecule spot. The photocatalyst can be $TiO_2$, $ZnO$, $SnO_2$, $SrTiO_3$, $WO_3$, $B_2O_3$, or $Fe_2O_3$, specifically, $TiO_2$.

In the present invention, "spot" is a certain region where an individual polynucleotide is immobilized.

Known processes of immobilizing biomolecules on the microarray substrate can be used in the method. Examples of immobilization methods include the photolithography method and the spotting method. According to the photolithography method, a polynucleotide microarray can be manufactured by repeating the following operation: exposing a certain region of the surface of a substrate which is coated with monomers protected by removable groups to a source of energy to remove the removable groups, and coupling the monomers to added monomers. In this method, a polynucleotide immobilized on the substrate is synthesized one monomer at a time by successive coupling of monomers to the end of the strand. According to the spotting method, a microarray is manufactured by immobilizing pre-synthesized polynucleotides at predetermined positions on the microarray substrate. Illustrative methods of preparing polynucleotide microarrays are disclosed in, for example, U.S. Pat. Nos. 5,744,305, 5,143,854, and 5,424,186, incorporated herein in their entirety by reference.

In one embodiment, the photocatalyst layer can be deposited on a substrate using any known technique. For example, the photocatalyst layer can be formed using a method comprising chemical vapor deposition (CVD), physical vapor deposition (PVD), sputtering, a sol-gel method, or the like, but the method is not limited thereto.

CVD is a thin film deposition method in which gaseous elements are chemically reacted on a substrate, such as a wafer or the like, to form a stable solid thin film. Various thin films such as a silicon nitride (SiN) thin film, a silicon oxide ($SiO_2$) thin film, a polycrystalline silicon (Poly-Si) thin-film, or the like can be deposited using CVD. Low pressure (LP) CVD is a thin film deposition method performed under a vacuum condition. Deposition speed of the thin film can be increased by forming a vacuum inside a chamber since it lowers the density of a by-product which can be generated by the presence of air.

PVD is a thin film formation method that has recently been favored as a means of surface curing, since a thin film can be more easily obtained by a low temperature treatment that cannot be performed using other methods. Examples of PVD methods include an evaporation deposition method that does not use ions, a sputtering method that uses ions, an ion plating method, an ion implantation method, an ion beam mixing method and the like. The evaporation deposition method is based on the principle that metal is evaporated when heated in a vacuum.

When a particle having high energy collides with a target material, atoms or molecules are ejected from the target material. This phenomenon is called sputtering. In sputtering, a target material and a substrate form an anode and a cathode, respectively, and then a high pressure of about $10^{-2}$ Torr is applied between the anode and cathode under an Ar atmosphere. As a result, Ar gas around the anode is ionized to be $Ar^+$ which collides with the anode. Molecules or atoms ejected by the ion bombardment are bound to the substrate, that is, the cathode, to form a thin film. Examples of sputtering include DC sputtering, RF sputtering, bias sputtering, magnetron sputtering and the like. Magnetron sputtering is a high speed sputtering method favored in various fields.

In a sol-gel method for photocatalyst layer deposition, a metal oxide having a colloid form is prepared through hydrolysis reaction of a metal halide or alkoxide. The sol-gel method is an exemplary method of preparing a coating solution of titanium dioxide ($TiO_2$). Physical characteristics of the titanium dioxide prepared, such as a particle size, crystalline structure and the like are affected by the particular kind of alkoxide used, reaction conditions (temperature, pH, a mol ratio between reactants, etc.) and the like.

In the method according to the invention, the organic thin film layer is significantly thinner than the photocatalyst layer. The organic thin film layer is a layer that can be oxidized by active oxygen or a hydroxyl radical, and comprises a composition comprising a functional group which can be connected to a biomolecule. The functional group can be an amino group, a carboxyl group, an epoxy group, a sulfur group, or the like, but is not limited thereto. An exemplary composition comprising a functional group to be connected to the biomolecule is ɣ-aminopropyltriethoxy silane (GAPS), other aminosilanes, or the like, but is not limited thereto.

In one embodiment, the photocatalyst layer can have a thickness such that upon irradiation of the layer with light, constructive interference occurs between light reflected from the substrate (first reflected light) and light reflected from the photocatalyst layer (second reflected light). In the present invention, the "thickness at which constructive interference occurs" is not a single fixed value; rather, it includes any thickness at which constructive interference occurs between the first reflected light and the second reflected light, resulting in increased intensity. In some embodiments, the range of thicknesses at which constructive interference occurs is predetermined.

In one embodiment, the reflectance of the substrate is greater than that of the photocatalyst layer and constructive interference occurs under the condition that the path difference, $2n \sin \theta d$, of the first reflected light and the second reflected light is as follows:

$$2n \sin \theta d = (2n+1)\lambda/2$$

wherein d is the thickness of the photocatalyst layer, n is reflectance, θ is the incidence angle of the incident light, and λ is the wavelength of the incident light. According to the equation, when the path difference of the first reflected light and the second reflected light is an odd multiple of half of the wavelength, constructive interference occurs. For example, if the wavelength λ is 532 nm, the reflectance n is 2.3 (for $TiO_2$), and the incidence angle θ is 90°, constructive interference occurs when the thickness of the photocatalyst layer d is 570 Å.

Destructive interference occurs under the condition $2n \sin \theta d = (2m)\lambda/2$ (m=1, 2, 3 ... ). Here for example, if the wavelength λ is 532 nm, the reflectance n is 2.3, the incidence angle θ is 90°, and m is 1, destructive interference occurs when the thickness of the photocatalyst layer d is 1156 Å.

Accordingly, constructive interference should occur when the thickness of the photocatalyst layer d is in the range of 350 through 1100 Å, with maximal constructive interference expected at a thickness of 570 Å, and in this range, a signal should be detected without destructive interference occurring. When the thickness of the photocatalyst layer is out of the range in which constructive interference of the light occurs, signal detecting sensitivity deteriorates.

In one embodiment, the diameter of a patterned spot on a microarray can be 100 μm or less. In contrast, since the size of a spot integrated using current sputtering is about 100 μm, the spot can not be patterned to have a smaller size by sputtering.

In one embodiment, the shape of the patterns of a patterned spot may be a circle, a lozenge, a regular tetragon, a rectangle, a star, or the like, but is not limited thereto. The shape of the patterns of the patterned spot can be determined by the shape of the photomask.

In an embodiment of the method, the substrate can be made of any material including polymers, metals, ceramics, oxides, and the like which can have a surface. An array is formed on or supported by the surface of the substrate. The substrate may be an inorganic material, organic material, composite, or polymer. Examples of the substrate include, but are not limited to, glass, silicon wafer, fused silica, gold, silver, copper, platinum, polystyrene, poly(methylacrylate), and polycarbonate. The surface of the substrate can be modified. Additionally, adsorption, chemical reactions, or physical interactions can occur between the modified surface and an element of an array, which can support, promote, or catalyze the formation of the array.

In an embodiment of the method, the biomolecule comprises a nucleic acid, such as DNA, RNA or peptide nucleic acid (PNA); a protein such as a peptide or a polypeptide; or a polysaccharide, but is not limited thereto.

The invention also provides a microarray manufactured using the method disclosed herein.

Figure 2:
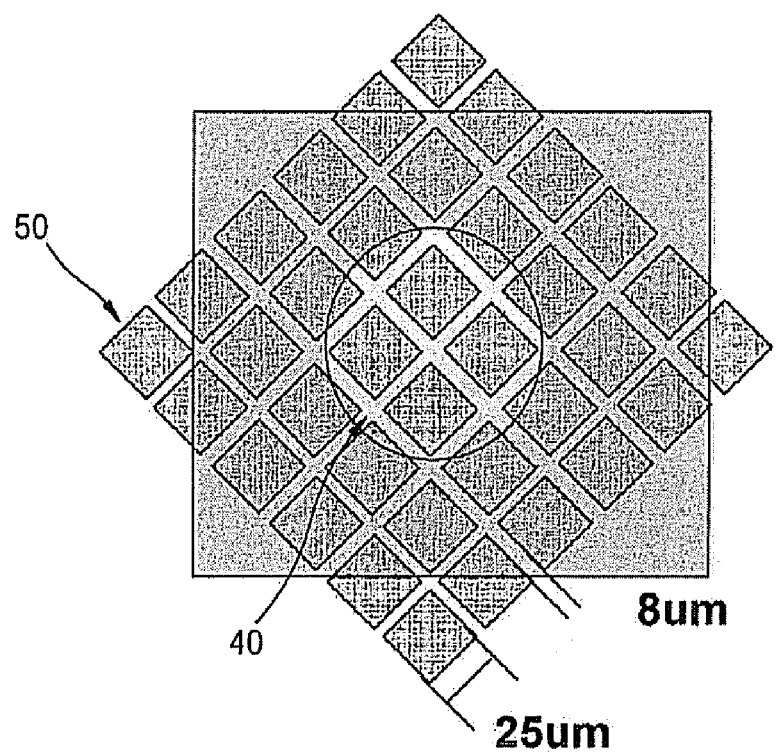
FIG. 2 is a diagram illustrating the photomask arranged on the spot of the microarray of FIG. 1.

FIG. 1 is a diagram illustrating a microarray according to an embodiment of the present invention and its method of preparation. Referring to FIG. 1, the microarray includes a microarray substrate 10, a photocatalyst layer 20, an organic thin film layer 30 and a biomolecule spot 40. A photomask 50 is arranged above the biomolecule spot 40 of the microarray, and then a patterned spot is formed by irradiating UV light on the structure. The size and shape of the patterns of the patterned spot are determined according to the shape of the photomask 50. FIG. 2 illustrates the photomask arranged above the biomolecule spot of the microarray of FIG. 1. Referring to FIG. 2, one spot can be divided into four spots by the photomask. Since one spot is divided into four spots, which can obtain four pieces of data, a final integration rate is increased by 4 times per unit area. In addition, if a spot, from which data cannot be extracted owing to a defect inside the spot, is divided partially, one or more divisions of the spot may become useable to extract data. The conventional method of patterning is complicated and needs various operations. However, according to one embodiment of the present invention, the organic layer may be easily patterned using only two operations (UV exposure and cleaning). Accordingly, the method according to the invention, in which a spotted biomolecule can be easily patterned by oxidizing the spot by irradiating it with UV light through a photomask, can be used in all fields preferably, in patterning a microarray or an insulating layer.

The invention also provides a microarray substrate comprising a photocatalyst layer formed by coating a photocatalyst on a substrate, and an organic thin film layer formed on the photocatalyst layer by coating a material having a functional group to be connected to a biomolecule. A microarray can be formed on the microarray substrate by spotting a plurality of biomolecules on the organic thin film layer. The biomolecule may include a nucleic acid, such as DNA, RNA or peptide nucleic acid (PNA); a protein such as a peptide or a polypeptide; or a polysaccharide, but is not limited thereto.

The present invention will now be described in further detail with reference to the following examples. These examples are for illustrative purposes only, and or not intended to limit the scope of the present invention.

EXAMPLE 1

Preparation of a Microarray Substrate

A substrate of silicon was used. An oxide layer ($TiO_2$) was formed on the substrate by thermal oxidation using a furnace SVF-200 apparatus (available from Seltron Inc.). Several test silicon substrates were coated with an oxide layer, with the thickness of the oxide layer on a given test substrate allowed to be from 350-650 Å.

The thickness of the oxide layer was measured using a NANOSPEC Model AFT 200 (available from NANOMETTICS Inc.). The NANOSPEC apparatus is based on the principle that when light is irradiated onto a silicon wafer with an oxide layer, some of the light is reflected by the oxide layer while some of the light passes through the oxide layer and is reflected by the silicon substrate. The phase difference between the light reflected by the oxide layer and the light reflected by the silicon substrate is then used to determine the thickness of the oxide layer. The thickness of the oxide layer was measured by placing the silicon wafer on a sample stage of the NANOSPEC apparatus. The thickness was measured at 5-6 points in the wafer and an average value was derived therefrom to be used for the coating thickness. All experiments were performed in a clean room-class 1000 from which most dust particles were removed.

A solution of 20% (vol/vol) GAPS (γ-aminopropyltriethoxy silane) in ethanol was spin coated on the substrate having the oxide layer using a spin coater model CEE 70 (available from CEE Inc.). The spin coating was done by performing an initial coating at 500 rpm/10 sec and a main coating at 2,000 rpm/10 sec. After the spin coating was completed, the substrate was fixed to a Teflon wafer carrier, incubated for 13 minutes, and then cured at 120° C. for 40 minutes. The cured substrate was immersed in water for 10 minutes, ultrasonically washed, immersed again in water for 10 minutes, and then spin-dried. The dried substrate was cut to have a square or rectangular shape and used in the experiments. All experiments were performed in a clean room-class 1000 from which most dust particles were removed.

The silanized substrate was dip-coated with fluorescein. First, fluorescein was dissolved in dimethyl formamide (DMF) to prepare an immersion solution (10 mM fluorescein). The immersion solution and the substrate were placed in a reaction container and reacted at 40° C. for 120 minutes. After completing the reaction, the substrate was removed from the immersion solution, and cleaned three times using DMF for 10 minutes each. The substrate was then cleaned three times using methanol for 10 minutes each. Thereafter, the substrate was dried, and the amount of fluorescein reacted with the substrate was determined using a GENEPIX 4000B scanner (available from Axon Inc.).

Figure 3:
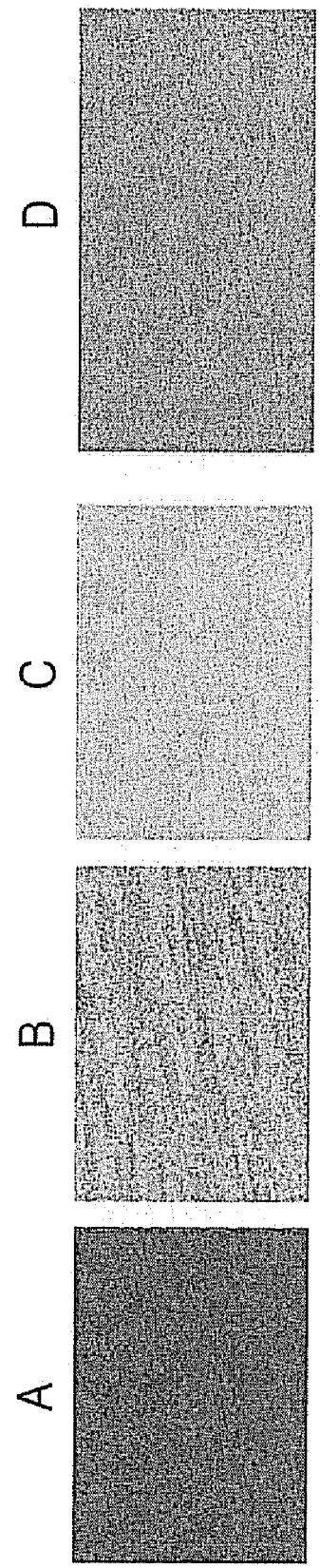
FIG. 3 are fluorescence intensity images illustrating the effect of various thicknesses of an oxide layer pattern on fluorescence intensity.

The results obtained are illustrated in FIG. 3. FIG. 3 shows fluorescence images illustrating the effect of varying thickness of an oxide layer pattern on the fluorescence intensity. Theoretically, maximal constructive interference of light reflected from a $SiO_2$ (reflectance=1.46) layer will occur for a layer having a thickness of 1000 Å and maximal constructive interference of light reflected from a $TiO_2$ (reflectance=2.36) will occur for a layer having a thickness of 570 Å. Kind of oxide layer, thickness of the oxide layer, fluorescence intensity, and relative ratio of fluorescence intensity of each panel formed are shown in Table 1. The relative ratio of fluorescence intensity of each panel is determined by comparing the measured fluorescence intensity of the panel to the fluorescence intensity of the $SiO_2$-layered panel.

TABLE 1

| Panel | Kind of oxide layer | Thickness of layer (Å) | Fluorescence intensity | Relative ratio |
|---|---|---|---|---|
| A | $TiO_2$ | 370 | 475 | 0.04 |
| B | $TiO_2$ | 530 | 2800 | 0.25 |
| C | $TiO_2$ | 600 | 4300 | 0.39 |
| D | $SiO_2$ | 1000 | 11000 | 1.00 |

Referring to FIG. 3 and Table 1, for a $TiO_2$ layer having a thickness of 600 Å, the fluorescence intensity of the $TiO_2$ is measured to be 40% of the fluorescence intensity of the $SiO_2$-layer control. Accordingly, a $TiO_2$-layer with a thickness of at least 570 Å can be used in measurement of fluorescence intensity as an alternative to the $SiO_2$ layer with a thickness of 1000 Å.

EXAMPLE 2

Preparation and Hybridization of a Polynucleotide Microarray (DNA Chip)

In this Example, probe polynucleotides were immobilized on a microarray substrate having a $SiO_2$ oxide layer having a thickness of 1,000 Å and a microarray substrate with a $TiO_2$ oxide layer having a thickness of 600 Å, as prepared in Example 1. Spots of probe polynucleotides were patterned on each substrate using a photomask, labeled target nucleic acids were hybridized to the probe polynucleotides, and then the fluorescence intensity was measured to investigate the effect of the patterned spot on the fluorescence intensity. First, as described in Example 1, the oxide layer was formed on a silicon substrate. The immobilization of probe polynucleotides to the oxide layer used a spotting process. A spotting solution was prepared by adding probe polynucleotides to a 25 mM $NaHCO_3$ (pH=9.0) solution; the resulting solution was left at 37° C. for 1 hour. The spotting solution was spotted on the oxide-layered substrate, and then the spotted oxide-layered substrate was left in a wet chamber at 70° C. under a relative humidity of 40% for 1 hour. Next, in order to control background by preventing target nucleic acids from binding to the substrate surface, amine groups in unspotted positions of the substrate surface were allowed to become negatively charged by treatment with succinyl anhydride, and then storing the substrate in a drying machine. Next, the substrate was irradiated with ultraviolet (UV light) irradiated through a 25 μm patterned photomask for 10 minutes to pattern the polynucleotide spots. The target polynucleotide, labeled with the fluorophore indocarbocyanine (Cy-3), was hybridized with the probe polynucleotide on the prepared substrate and then fluorescence was measured at a wavelength of 532 nm.

Figure 4:
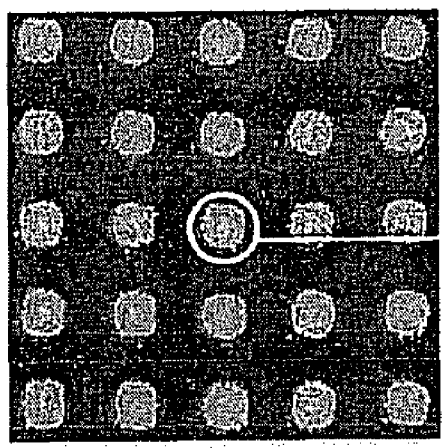
FIG. 4 are fluorescence intensity images obtained after hybridization of target nucleic acids to microarrays prepared according to an embodiment of the invention.
Figure 4:
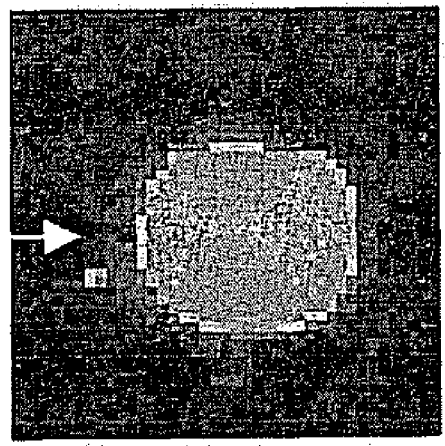
Figure 4:
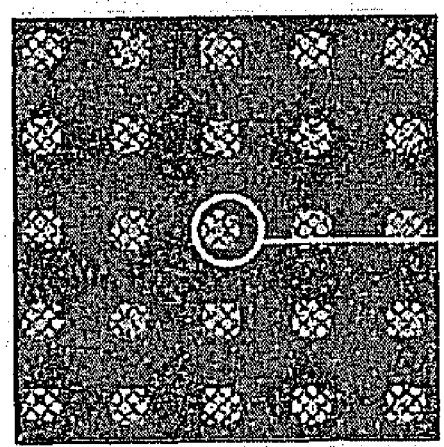
Figure 4:
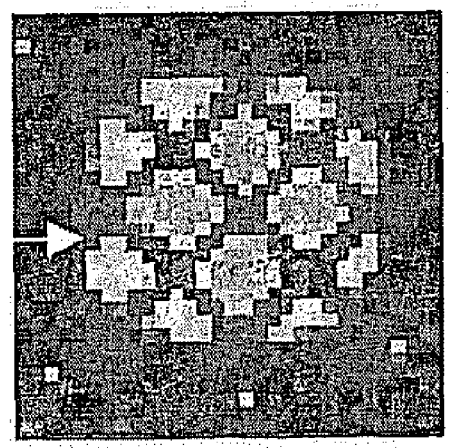
Figure 4:
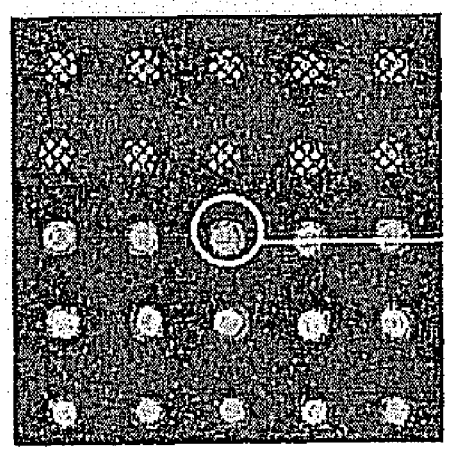
Figure 4:
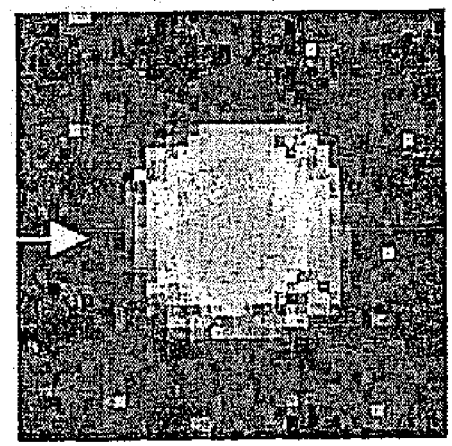

The results obtained are illustrated in FIG. 4. FIG. 4 presents fluorescence images subsequent to hybridization of target nucleic acids. Referring to FIG. 4, the three right panels show one enlarged spot of a number of spots from each left panel. Panel A shows results for a substrate with $SiO_2$ as the oxide layer. Panel B shows results for a substrate with $TiO_2$ as the oxide layer and UV patterning. In panel C, the substrate had $TiO_2$ as the oxide layer and UV patterning was performed on the two upper lines of spots but not for the three lower lines of spots.

Referring to FIG. 4, oxide layers were formed to have a thickness of 1,000 Å ($SiO_2$) or 600 Å ($TiO_2$) in order to obtain constructive interference of light. The resulting products were coated with GAPS, and spotted with probe oligonucleotide (SEQ ID NO: 1: 5'-GATGGAAGGTGCTGGGAGC-3') and immobilized. Target oligonucleotide (SEQ ID NO: 2: 5'-GCTCCCAGCACCTTCCATC-3',) labeled with Cy-3, was then hybridized to the probe oligonucleotide. Fluorescence intensity of the resulting hybridization product was measured at 532 nm. Mean fluorescence intensity of a spot, mean spot size, and relative ratio of fluorescence intensity in comparison with the $SiO_2$ control are shown in Table 2.

TABLE 2

| Panel | Kind of oxide layer | Thickness of layer (Å) | Mean fluorescence intensity | Mean spot size (μm) | Relative ratio |
|---|---|---|---|---|---|
| A | $SiO_2$ | 1000 | 23068 | 115 | 1.00 |
| B | $TiO_2$ | 600 | 8229 | 25 | 0.35 |
| C | $TiO_2$ | 600 | 6785 | 95 | 0.29 |

Referring to FIG. 4 and Table 2, fluorescence intensity of $TiO_2$ is slightly smaller than that of $SiO_2$ for the samples of panels B and C. However, for panel B, which was patterned, the mean spot size is 25 μm, substantially smaller in comparison with the mean spot size of 115 μm for the A panel or 95 μm for a non-patterned spot on the C panel.

Accordingly, it can be seen that spot size of a microarray can be remarkably reduced using $TiO_2$ as a photocatalyst according to the present invention.

According to the present invention, a spot having a size less than 60 μm, which is the minimum size that can be formed using known spotting methods, can be manufactured. Thus, a more integrated chip can be manufactured. The shape of a spot, which has previously been determined according to conventional spotting pins, can be easily regulated since patterning can be easily performed using only UV exposure without need for a photoresist, baking, coating, or the like. Furthermore, some damaged spots that can not be used to extract data in a conventional pin array spot, may yield usable spots resulting from usable regions of a patterned damaged spot using the methods of the present invention. Accordingly, the present invention can minimize data loss by spot damage.

The terminology used herein is for the purpose of describing particular embodiments only and is not intended to be limiting of the invention. The terms "a" and "an" do not denote a limitation of quantity, but rather denote the presence of at least one of the referenced item. The term "or" means "and/or". The terms "comprising", "having", "including", and "containing" are to be construed as open-ended terms (i.e., meaning "including, but not limited to").

Recitation of ranges of values are merely intended to serve as a shorthand method of referring individually to each separate value falling within the range, unless otherwise indicated herein, and each separate value is incorporated into the specification as if it were individually recited herein. The endpoints of all ranges are included within the range and independently combinable.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein. Unless defined otherwise, technical and scientific terms used herein have the same meaning as is commonly understood by one of skill in the art to which this invention belongs.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of preparing a patterned spot microarray comprising:
   coating a photocatalyst on a substrate to form a photocatalyst layer;
   coating a composition on the photocatalyst layer to form an organic thin film layer coated on the photocatalyst layer, wherein the organic thin film layer comprises a functional group to be connected to a nucleic acid;
   spotting the nucleic acid on the organic thin film layer and immobilizing the nucleic acid;
   positioning a photomask above a spot of the immobilized nucleic acid; and
   irradiating the spot of the immobilized nucleic acid with ultraviolet light through the photomask to form a pattern on the spot of the immobilized nucleic acid,
   wherein nucleic acid irradiated with light through the photomask is oxidized to reduce the size of the nucleic acid spot, and
   wherein target nucleic acid present in a sample does not hybridize to the patterned spot microarray in an area where the nucleic acid has been irradiated with light through the photomask.-

2. The method of claim 1, wherein the photocatalyst comprises $TiO_2$, ZnO, $SnO_2$, $SrTiO_3$, $WO_3$, $B_2O_3$, or $Fe_2O_3$.

3. The method of claim 1, wherein the photocatalyst layer is formed using chemical vapor deposition (CVD), physical vapor deposition (PVD), sputtering or a sol-gel method.

4. The method of claim 1, wherein the functional group to be connected to the nucleic acid comprises an amino group, a carboxyl group, an epoxy group, or a sulfur group.

5. The method of claim 1, wherein the composition comprises ɣ-aminopropyltriethoxy silane (GAPS).

6. The method of claim 1, wherein the photocatalyst layer has a thickness such that constructive interference occurs between first reflected light of irradiated excitation light reflected from the substrate and second reflected light of irradiated excitation light reflected from the photocatalyst layer.

7. The method of claim 6, wherein the photocatalyst layer has a thickness in the range of about 350 to about 1100 Å.

8. The method of claim 1, wherein a diameter of the patterned spot of the immobilized nucleic acid is about 100 μm or less.

9. The method of claim 1, wherein a shape of a pattern of the patterned spot of the immobilized nucleic acid is a circle, a lozenge, a regular tetragon, a rectangle or a star.

10. The method of claim 1, wherein the substrate is glass, a silicon wafer, fused silica, gold, silver, copper, platinum, polystyrene, poly(methacrylate), or polycarbonate.

11. The method of claim 1, wherein the nucleic acid is selected from DNA, RNA or peptide nucleic acid.

12. The method of claim 1, wherein target nucleic acid hybridizes to the patterned spot microarray in an area where the nucleic acid has not been irradiated with light through the photomask.

* * * * *